(12) United States Patent  
Allen (10) Patent No.: US 8,756,466 B2
(45) Date of Patent: Jun. 17, 2014

(54) METHOD AND SYSTEM THEREOF FOR OPTIMIZATION OF POWER CONSUMPTION OF SCAN CHAINS OF AN INTEGRATED CIRCUIT FOR TEST

(71) Applicant: Atrenta, Inc., San Jose, CA (US)

(72) Inventor: David Allen, Fremont, CA (US)

(73) Assignee: Atrenta, Inc., San Jose, CA (US)

( * ) Notice: Subject to any disclaimer, the term of this patent is extended or adjusted under 35 U.S.C. 154(b) by 0 days.

(21) Appl. No.: 13/847,938

(22) Filed: Mar. 20, 2013

(65) Prior Publication Data

US 2013/0212545 A1 Aug. 15, 2013

Related U.S. Application Data

(63) Continuation of application No. 12/910,510, filed on Oct. 22, 2010, now Pat. No. 8,423,843.

(51) Int. Cl.
*G06F 11/00* (2006.01)

(52) U.S. Cl.
USPC .......................................... 714/726; 716/136

(58) Field of Classification Search
None
See application file for complete search history.

(56) References Cited

U.S. PATENT DOCUMENTS

| | | |
|---|---|---|
| 5,907,562 A | 5/1999 | Wrape et al. |
| 6,075,932 A | 6/2000 | Khouja et al. |
| 6,363,515 B1 * | 3/2002 | Rajgopal et al. ............. 716/105 |
| 6,519,729 B1 | 2/2003 | Whetsel |
| 6,622,287 B1 | 9/2003 | Henkel |
| 6,694,467 B2 | 2/2004 | Whetsel |
| 6,732,310 B1 | 5/2004 | Chakradhar et al. |
| 6,735,744 B2 | 5/2004 | Raghunathan et al. |
| 6,766,487 B2 | 7/2004 | Saxena et al. |
| 6,876,934 B2 | 4/2005 | Mariett |
| 7,086,019 B2 | 8/2006 | Keller et al. |
| 7,155,650 B2 | 12/2006 | Whetsel |
| 7,181,664 B2 | 2/2007 | Lee et al. |
| 7,277,840 B2 | 10/2007 | Mariett |
| 7,356,745 B2 | 4/2008 | Whetsel |
| 7,526,695 B2 | 4/2009 | Whetsel |
| 7,555,688 B2 | 6/2009 | Alvamani et al. |
| 7,617,429 B2 | 11/2009 | Saxena et al. |
| 7,657,811 B2 | 2/2010 | Whetsel |
| 7,992,125 B2 | 8/2011 | Chen |
| 8,127,188 B2 | 2/2012 | Hasegawa |
| 8,201,121 B1 | 6/2012 | Sankaralingam et al. |
| 2004/0236560 A1 | 11/2004 | Chen |

(Continued)

*Primary Examiner* — Yolanda L Wilson
(74) *Attorney, Agent, or Firm* — Thomas Schneck; Mark Protsik (57) ABSTRACT

Scan blocks with scan chains are used to partition and test semiconductor devices using scan groups. The partitioning of the semiconductor device enables testing of all elements within each scan block, at speed, to provide fault coverage. A challenge in scan testing is keeping the power dissipation during testing under the allowed power capabilities of the tester power supplies, as the power used during scan test is much higher than that used during functional testing. A method for estimating the power dissipation of scan blocks in a circuit during the design stage is disclosed. Using the results generated, the circuit designer divides the design into an optimum number of scan blocks for test. Thus at-speed scan of the individual or groups of scan blocks can be estimated, during design, for optimizing test time while keeping the test power within acceptable limits.

7 Claims, 5 Drawing Sheets

(56) References Cited

U.S. PATENT DOCUMENTS

| | | |
|---|---|---|
| 2004/0243958 A1 | 12/2004 | Bednar et al. |
| 2005/0010832 A1 | 1/2005 | Caswell et al. |
| 2005/0257078 A1 | 11/2005 | Bose et al. |
| 2006/0150136 A1 | 7/2006 | Bratt et al. |
| 2006/0242515 A1 | 10/2006 | Alvamani et al. |
| 2007/0106965 A1 | 5/2007 | Ohta et al. |
| 2008/0021692 A1 | 1/2008 | Chaudhry et al. |
| 2011/0099400 A1 | 4/2011 | Allen |

* cited by examiner

METHOD AND SYSTEM THEREOF FOR OPTIMIZATION OF POWER CONSUMPTION OF SCAN CHAINS OF AN INTEGRATED CIRCUIT FOR TEST

CROSS-REFERENCE TO RELATED APPLICATION

This patent application is a continuation of U.S. patent application Ser. No. 12/910,510 filed on Oct. 22, 2010, now allowed, which claims priority from U.S. provisional patent application No. 61/279,603 filed on Oct. 23, 2009, entitled "A Method for Estimation of Power Consumption of an Integrated Circuit for Test", and which is hereby incorporated by reference in its entirety.

BACKGROUND

1. Technical Field

The present disclosure relates to the field of power modeling and power estimation of Integrated Circuit (IC) blocks during the design stage for subsequent testing of the IC blocks. More particularly, the present disclosure relates to optimization of test time and test power during scan testing of a system on chip ICs, while providing maximum test coverage.

2. Description of the Related Art

The power grids for today's system-on-chip (SOC) IC testers are designed for maximum power consumption. Typical SOCs are tested by the testers based on the expected worst case power for normal operation mode of the SOCs, which allows for switching a very low percentage of the circuit elements during normal operation. In related art scan testing, the entire chip is tested at the same time, so a much larger percentage of circuit elements switch, causing the power to be too high for the tester's power grid. The alternative in the related art is to divide the long scan chain (which includes all the circuit elements of the SOC) into a small number of scan groups. Then, during scan testing each test covers one scan group, while the remainder of the chip is inactive. This way the total power consumption is within acceptable limits of the tester. However, as the number of scan groups increases, the total test time and test cost increases.

Typically scans are run at the expected maximum normal operational speed, also referred to as 'at speed', for each of the scan blocks of a SOC, with the aim of providing a high speed test with maximum test coverage. This results in an increase in the number of active operational elements switching simultaneously, when compared to a functional test of the blocks using a test program, and hence the power consumption may exceed the allowed tester power supply capability. This results in an inability to provide test coverage of the device, using scan chains, without exceeding the power bus capacity of the tester as no prior knowledge of the power dissipation is available till an actual scan test is run.

In some cases it may be possible to solve the problem by slowing down the scan frequency, which increases test time and test cost. It also eliminates the test of the circuits at speed creating uncertainty of a circuit's capability to function at speed under all conditions.

Another possibility is to design the SOC so that it is divided into multiple small scan groups where each scan group is small enough to ensure that the power dissipation is small when separately tested. Since individual scan group testing takes a definite time to program and test, for providing the necessary test coverage, the SOC testing time is increased in proportion to the number of scan groups of the IC. Combining scan groups to enable optimum number of test groups is difficult as it has to be done before the chip is fabricated and before the actual power consumption is known. Even after combining the scan groups this way, the combinations have to be verified to ensure that interactions between circuit components and peripherals do not cause the combination to miss out on desired test coverage and also exceed the power limit of the tester.

Even though the need is acute, today there is no good way to ensure that some particular division of the SOC into scan groups, either functional or otherwise, is optimum before the SOC is ready for test. An optimum set of scan groups is where each group is "safe", i.e., within the power range allowable for the tester's power grid, yet optimized for the minimum number of scan groups to save test time. There is no method in the related art for achieving the optimization of scan partitions at the design stage of the SOC.

SUMMARY

Accordingly, one or more exemplary embodiments provide an apparatus integrated within an SOC circuit for optimizing power consumption of circuit portions of respective of scan groups of the SOC circuit during testing of the SOC circuit. The power driving capabilities of a tester testing the SOC circuit is taken into account when performing tests respective of the power consumed by the scan groups.

An exemplary embodiment is achieved by providing an apparatus integrated into a design of a system-on-chip (SOC) circuit, the apparatus connected to a plurality of scan groups having one or more clock domains therein, the scan groups further having peripheral isolation and a defined activity factor (AF) for each of the plurality of scan groups, wherein the apparatus is configured to divide the SOC respective of an estimation of power dissipation of each of the plurality of scan groups.

For the estimation of power dissipation, the apparatus may include a first circuit which generates one or more scan groups using at least a register-transfer-level (RTL) design description of the SOC circuit and a circuit library corresponding the SOC circuit, a second circuit which establishes a peripheral interaction factor (PIF) for each of the plurality of scan groups, a third circuit which performs a power simulation for each of the plurality of scan groups, a fourth circuit which generates a report for each of the plurality of scan groups containing at least power consumption data of the plurality of scan groups obtained in response to the power simulation for the plurality of scan groups, and a fifth circuit which optimizes the testing of the SOC by grouping the plurality of scan groups into a plurality of test groups based on the power consumption of the plurality of scan groups as provided in the report and at least one of a tester's power capability, desired test time, and test cost on the tester.

DETAILED DESCRIPTION OF EXEMPLARY EMBODIMENTS

Below, exemplary embodiments will be described in detail with reference to accompanying drawings so as to be easily realized by a person having ordinary knowledge in the art. The exemplary embodiments may be embodied in various forms without being limited to the exemplary embodiments set forth herein. Descriptions of well-known parts are omitted for clarity, and like reference numerals refer to like elements throughout.

The following are definitions of terms used in the description herein below:

Scan chain. A set of scan flip-flops (FFs) with a common test clock; the Q output of the first FF is connected to the scan input of the second FF, and so on, down the chain. A SOC may have a large number of scan chains to enable loading data in parallel and testing.

Scan mode. In at-speed test, the registers comprising the FFs must be loaded with data by scanning. The data is loaded into (and later read out of) the registers during scan mode. Clocks in scan mode may be run at lower speed if needed, or if limited by the hardware tester.

Capture mode. In at-speed test, once data is loaded into the registers, each clock is pulsed twice at full system speed. This short burst is called capture mode. Frequencies of the same clock may differ between scan and capture modes.

Scan group. In order to reduce peak power, the scan chains on a chip may be partitioned into multiple scan groups. A scan test uses only one of the scan groups, and the clocks to the other scan groups are inactive.

Periphery register. In scan group architectures the registers which are directly connected to the primary inputs and outputs of the block are called periphery registers. Periphery group comprising periphery registers enable the I/O operation to be verified without the impact of the internal SOC logic circuits.

Scan tests on groups. All of the registers in the test block which make up the scan group are scanned during the test of the block itself. The active logic connections between registers have to be evaluated for live condition during the testing of any scan group.

Scan blocks with scan chains are used to partition and test semiconductor devices using scan groups. The partitioning of the semiconductor device enables testing of all elements within each scan block, at speed, to provide test fault coverage. A challenge in scan testing is keeping the power dissipation during the testing under the allowed power of the tester power supplies, as the power used during scan test is much higher than that used during functional test. This is due to the higher utilization factor used during scan test. Exemplary methods of the present disclosure include a method for estimating the power dissipation of scan blocks in a circuit during the design stage is disclosed. Using the results generated, the circuit designer divides the design into an optimum number of scan blocks for test. Thus at-speed scan of the individual or groups of scan blocks can be estimated, during design, for optimizing test time while keeping the test power within acceptable limits.

During testing the functional test is used to cover the critical functionality of the devices but this does not test for fault coverage of all devices. Scan test is used to test almost all logic and switching elements within the boundaries of the scan blocks under test. This is hence used to test for fault coverage to ensure all usable circuit elements are tested, to provide coverage to meet the necessary reliability criteria of the designed circuit. Scan testing results in very high power dissipation compared to functional test, if the IC is tested as a whole. Hence it is necessary to partition the IC into scan groups to keep the power dissipation during the testing within limits subject to the capabilities of the tester power supplies. This increased power dissipation during scan test is taken care of by an activity factor that takes into account the percentage of active elements switching in the selected portion of the circuit covered by a scan group.

Disclosed is a method for estimation of the power dissipation of scan blocks in a circuit during the design stage of the circuit. Using this method the integrated circuit can be divided, based on the estimation, at the design stage into an optimum number of scan blocks for testing, using the design and verification system used by the designer. At-speed scan of the individual or groups of scan blocks can be estimated, during design, for optimizing test time while keeping the test power within acceptable limits for the tester used.

The exemplary method is based on scan power estimation (SPE) to provide estimation for scan mode power dissipation, either by scanning (i.e., testing) all scan chains (groups) or by scanning any particular "scan group". The SPE methodology is typically implemented during the design stage of the IC on the design and verification systems used by the designer. This does not limit the SPE method being implemented on a separate dedicated power estimation system once the design takes care of the partitioning of the IC for implementation as scan groups. The designer typically uses an existing design system and design methodology to complete the IC design and generate system test benches. The system test bench verifies the functional operation and also provides information on the power consumption of the IC in functional mode during SOC design. A standardized reporting format and forms are used to report these results. These same design systems used for scan group insertion during design and standardized reporting format are used with SPE to present the scan power results for understandability.

In accordance with a non-limiting embodiment, power reports for the different scan group scenarios, as defined by the designer, are generated. The designer can then quickly try multiple sets of scan group scenarios, receiving a power estimate for each scan group or a set of scan groups. This result is used to ensure that the power required by a selected scan group, or scan group set, does not exceed the maximum allowed power for a tester used.

A methodology to provide power estimation for "all scan groups active simultaneously", "multiple scan groups active", and "each scan group active by itself" is defined, during design. This is aimed at using the information about scan groups to generate multiple scan scenarios for the defined tester and any other tester that may become available.

Figure 1:
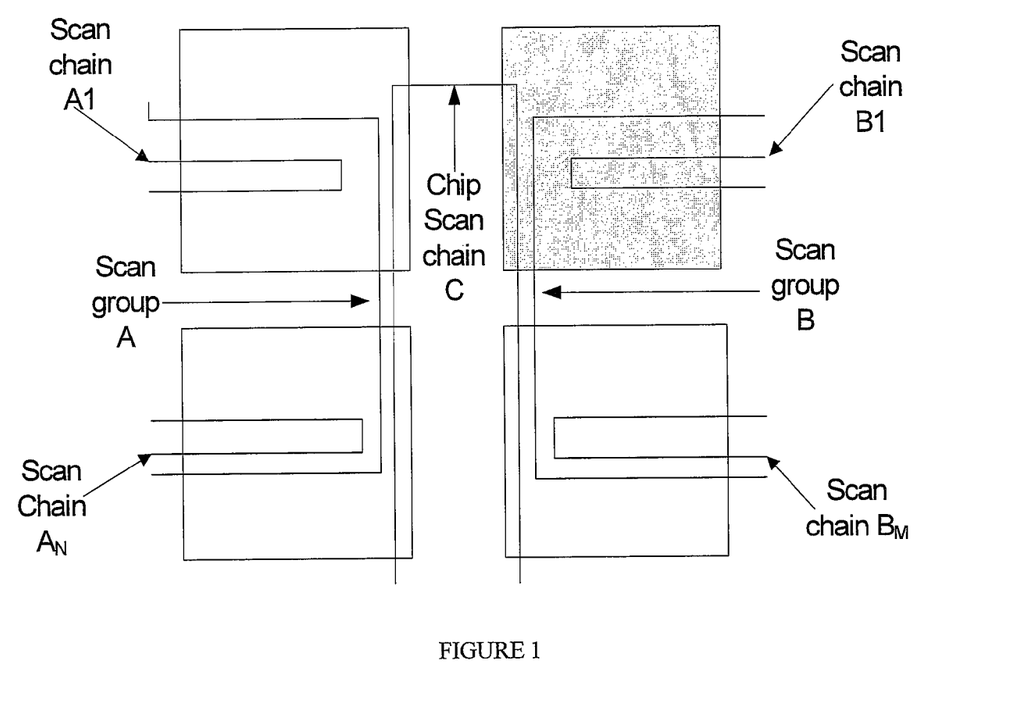
FIG. 1 illustrates a partitioning scheme for scan grouping according to an exemplary embodiment.

FIG. 1 shows an exemplary and non-limiting schematic of scan groups in an SOC. The SOC includes scan group A at the left side of the SOC, scan group B at the right side, and scan group C in the middle. Even within scan group A there are sub-scan groups (or scan chains) A1 to An, as is the case with scan group B where sub-scan groups (or scan chains) B1 to Bm exist.

During design each of the scan groups is provided with a name to distinguish them from each other. Typically in any IC, a number of groups are defined. Each group consists of a number of registers. For example a peripheral group is defined to contain only the periphery registers.

Figure 2:
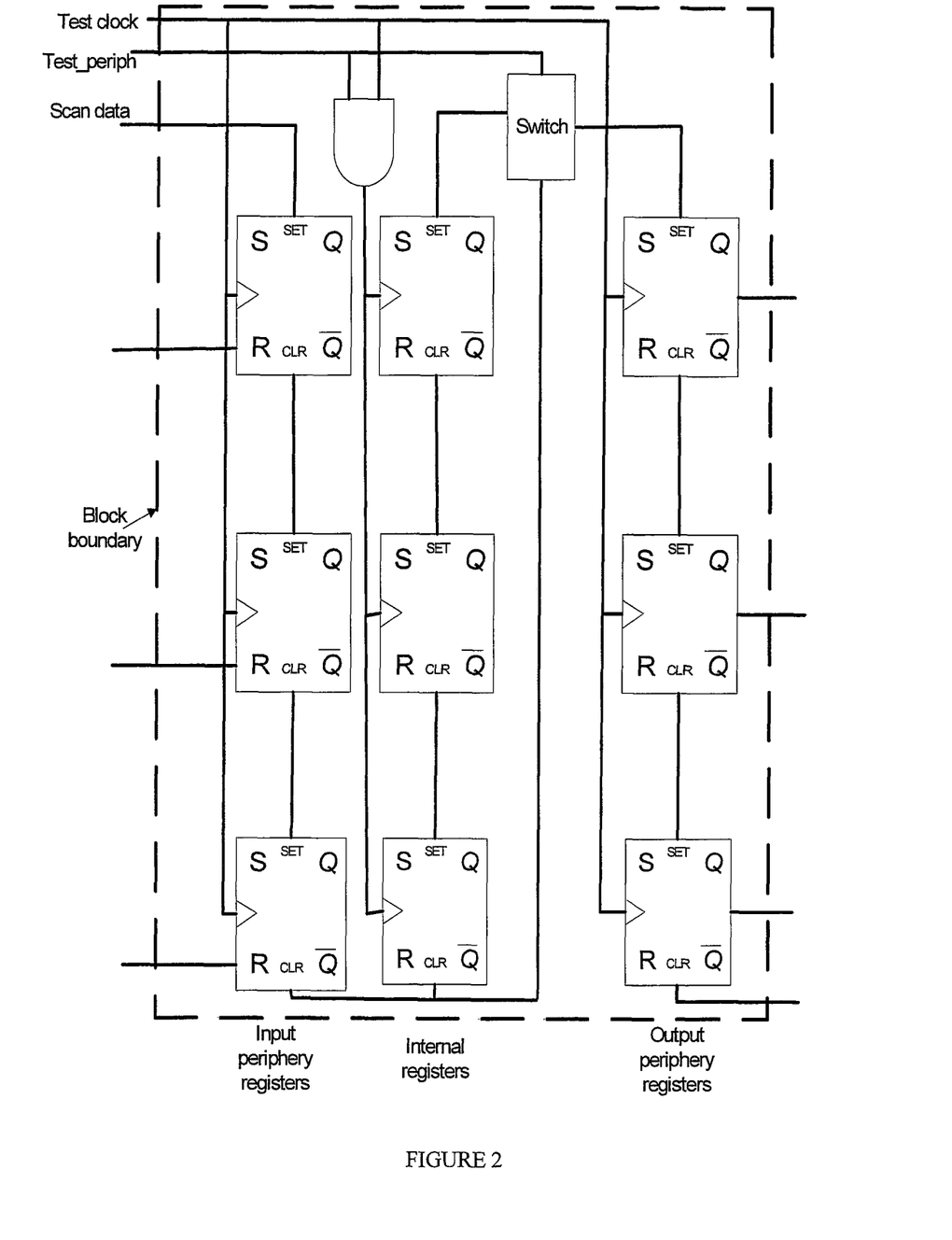
FIG. 2 illustrates a schematic of registers in a scan group according to an exemplary embodiment.

FIG. 2 shows an exemplary and non-limiting embodiment of a scan group, for example scan group A shown in FIG. 1. During verification each scan group is defined uniquely, typically, by its name. Hence a single scan group is made active or a multiple of scan groups are made active for any single test using the scan group names. If no definition or name is provided for a test then all scan groups will be assumed active and a full circuit scan test takes place.

It is possible to have a set of registers to belong to multiple scan groups. For example the peripheral input registers can belong to a peripheral scan chain of a peripheral scan group, as well as other scan groups including functional scan chains, which contain internal registers of the internal circuit used in a scan test. The Test clock signal is used to clock the FFs during the scan operation. The Test_periph signal enables the scanning of either the entire scan group FFs, when the switch is in a first position responsive of the Test_periph signal, or only the peripheral FFs, when the switch is in a second position responsive of the Test_periph signal. The Scan data signal is the path for the scanned data from one FF to another in the scan path.

Figure 3:
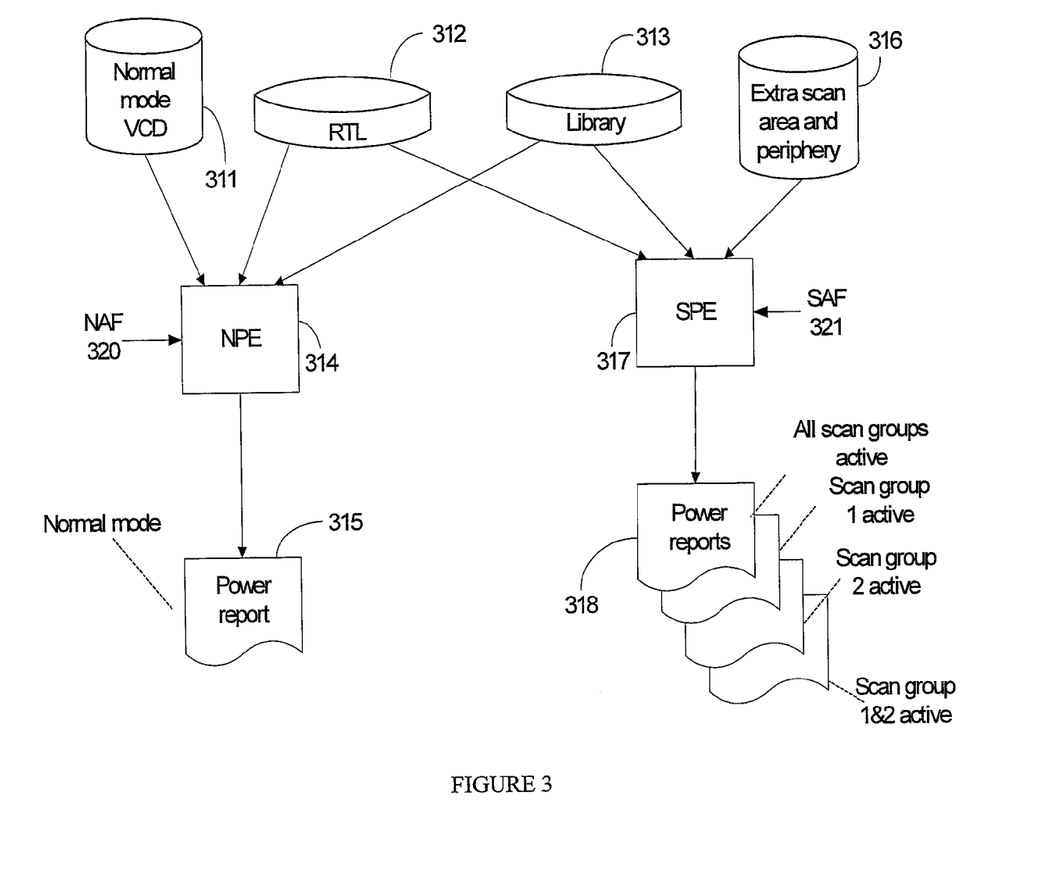
FIG. 3 illustrates a power estimation system with input and output for scan mode and normal mode function power estimation according to an exemplary embodiment.

FIG. 3 shows an exemplary and non-limiting system that is used for both functional power estimation and scan power estimation data including the generation of reports. In order to perform normal mode functional power estimation (NPE) 314 and scan mode power estimation (SPE) 317, three inputs are required at a minimum: the register transfer level (RTL) input 312 for the design, the library files with power models (LF) 313, and a simulation database value change dump (VCD) 311, or fast signal data base (FSDB), showing the activity factor (AF) with normal mode activity factor (NAF) 320 in normal operational mode. Activity factor is also possible to be specified for scan mode, the scan mode activity factor (SAF) 321. Extra scan area and periphery data 316 can also be provided to the SPE 317. Given these inputs, VCD 311, RTL 312, LF 313, and NAF 320, an NPE is run 314 to get a power report 315, in normal mode. These results are reported as a power report (PR) 315 which includes a spreadsheet of conditions against power as per a standardized reporting format. It is not necessary to combine the two power estimation systems, but since some of the same inputs are used by both systems, and the reporting format is similar, it is simpler to have them configured as a single system.

In one non-limiting embodiment, the same standardized reporting format is used with SPE 317 for recording the results and generating the PR 318 of the scan tests. In some special circuit cases the SPE 317 gives values which are different from actual due to the SAF 321 used for the calculation. For example, when estimating power dissipation of memories, where the utilization factor is very small, the use of standard SAF 321, typically 50%, used for standard scan groups in SPE 317 will tend to overestimate the values and provide results that are quite different from real values. Hence it is necessary to eliminate known special circuits from the scan groups used for SPE 317 or to establish the special circuits as a special scan group and provide a special SAF 321 for these groups to test these special circuits. These special groups SAF 321 are estimated from prior knowledge of percentage of the circuit being active during operation.

SAF 321 is indicative of the power consumption due to switching of registers in any scan group, and typically has a value of 50%. In order to provide coverage of all the sub circuits in a typical scan group, 50% of the scan registers are switched high while the rest are switched low hence the typical value for SAF 321 is 50%. In this embodiment, the SAF 321 does not include the interface between a scan group and the neighboring scan groups where logic circuits not connected via registers are active. It may be necessary to set up the interface so as to minimize or eliminate unwanted circuits draining power around the periphery of any scan group by limiting these circuits. Typically this is done during the design process when the scan groups are defined by providing registered boundaries and the capability to shut off clocks to these registers to make them inactive. Where it is not possible to completely limit this interaction, a factor, especially where logic circuits are involved, termed peripheral interaction factor (PIF) is used to take care of this interaction. The PIF can be provided as an input to the SPE 317. PIF is estimated by estimating the peripheral power from active logic circuits when the registers on the boundary are all turned off. This estimate is provided by the designer who is best equipped to decide this value. The closeness of the estimation can be verified during test In order to perform SPE 317 according to a non-limiting embodiment, RTL 312, SAF 321, and the LF 313 are required. In addition, extra scan data 316 are provided to the SPE 317 as shown in FIG. 3. This extra data 316 includes: information about the clock frequencies in both scan and capture modes; scan group definitions indicating scan groups defined by unique names, and which registers belong to which scan group; identification of special scan groups with their SAF; and the PIF which indicates activity ratio of the internal circuits of the scan group to the activity of circuit external to the selected scan group at interface between the two.

An advantage of the SPE 317 is its capability to instantiate multiple clocks of differing frequencies as necessary during power estimation and hence during test. This is done by estimating a new SAF 321 using the ratio of clock frequencies affecting individual sets of registers. This also enables certain clocks to be run slower or faster during testing to save time and energy and hence cost. This capability allows the test power to be estimated with different scan groups running at different clock frequencies to enable optimized testing of a set of scan groups to be within the tester power budget while reducing test time.

Once the scan groups are setup, power estimation verification runs are performed using scan SPE tools 317 with the required information. A SPE 317 run can be performed initially to give a power estimate for the situation where all scan groups are active. Then for each scan group defined, a subsequent run can be performed making that scan group active, producing a report showing the power when that group is active and all other scan groups are inactive. Scan power estimation runs are performed to cover individual and combination of scan power groups. By understanding the test hardware capabilities it is possible then to choose combination of multiple scan groups into one or split a high power scan group into two to optimize the testing of the SOC with optimized scan groups for power and time. Multiple scan reports 318 are generated with combination of scan groups to identify and optimize combination of scan groups, as shown in FIG. 3. Using these results a test program is generated, for each tester used to ensure an optimum number of scan tests to achieve coverage of the manufactured device. This approach requires much less development effort compared to having the functional and test scan chains tested with no prior idea of the power drain on testers, resulting in possible tester failure, and then trying to optimize the scan groups to reduce the test time.

Once the optimized scan chains are defined, these are verified on a manufactured SOC. On an initially manufactured circuit each of the scans can be initially measured to verify the accuracy of SPE 317. This measured feedback allows the SPE process 317 to be improved especially for special circuits in the scan group. This SPE method 317 helps reduce overall test time, provides improved test coverage with reduced cost of test, and verification of an IC under test, without overloading the tester power grid.

Figure 4A:
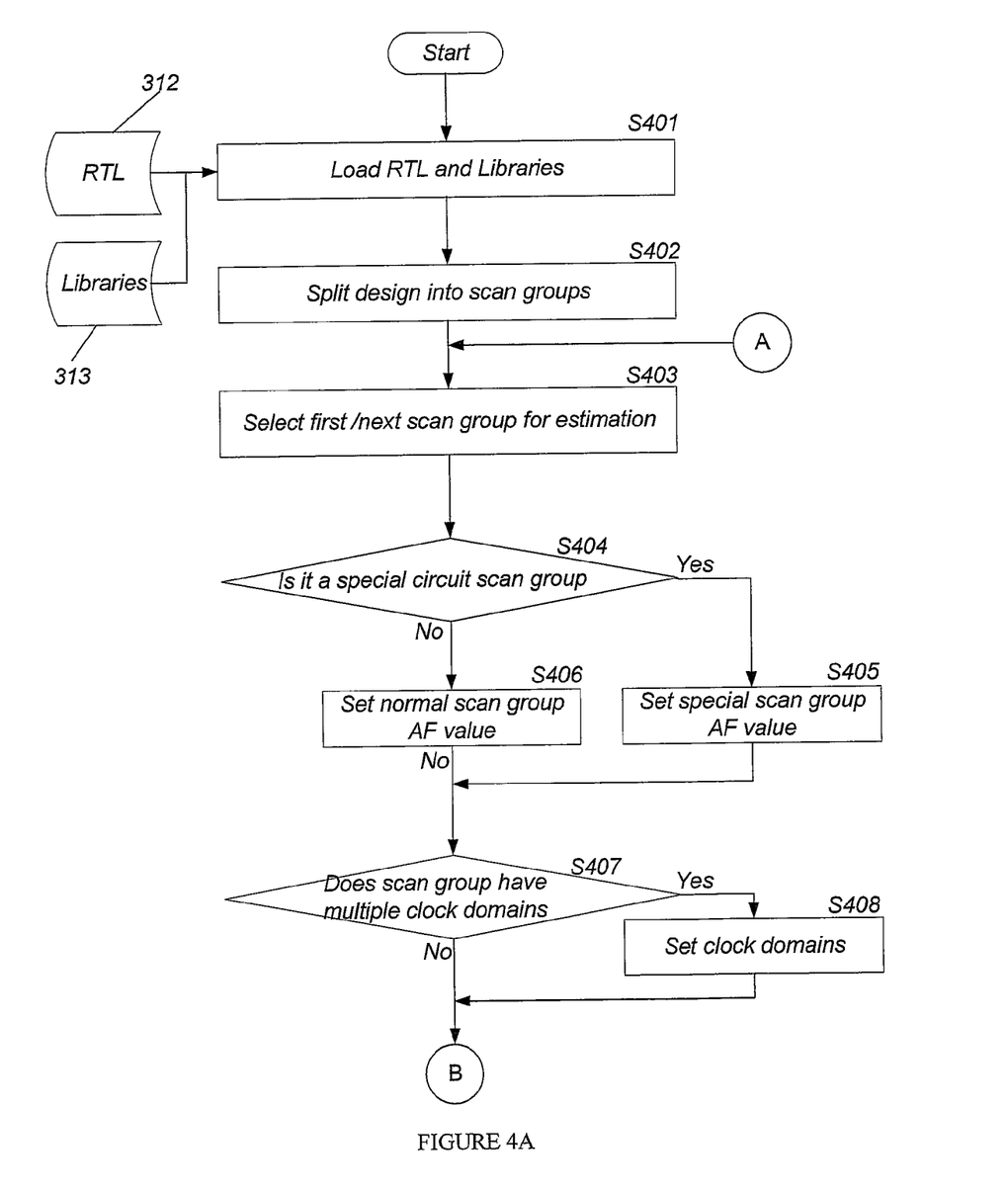
FIGS. 4A and 4B illustrate a flowchart of a scan power estimation process according to an exemplary embodiment.
Figure 4B:
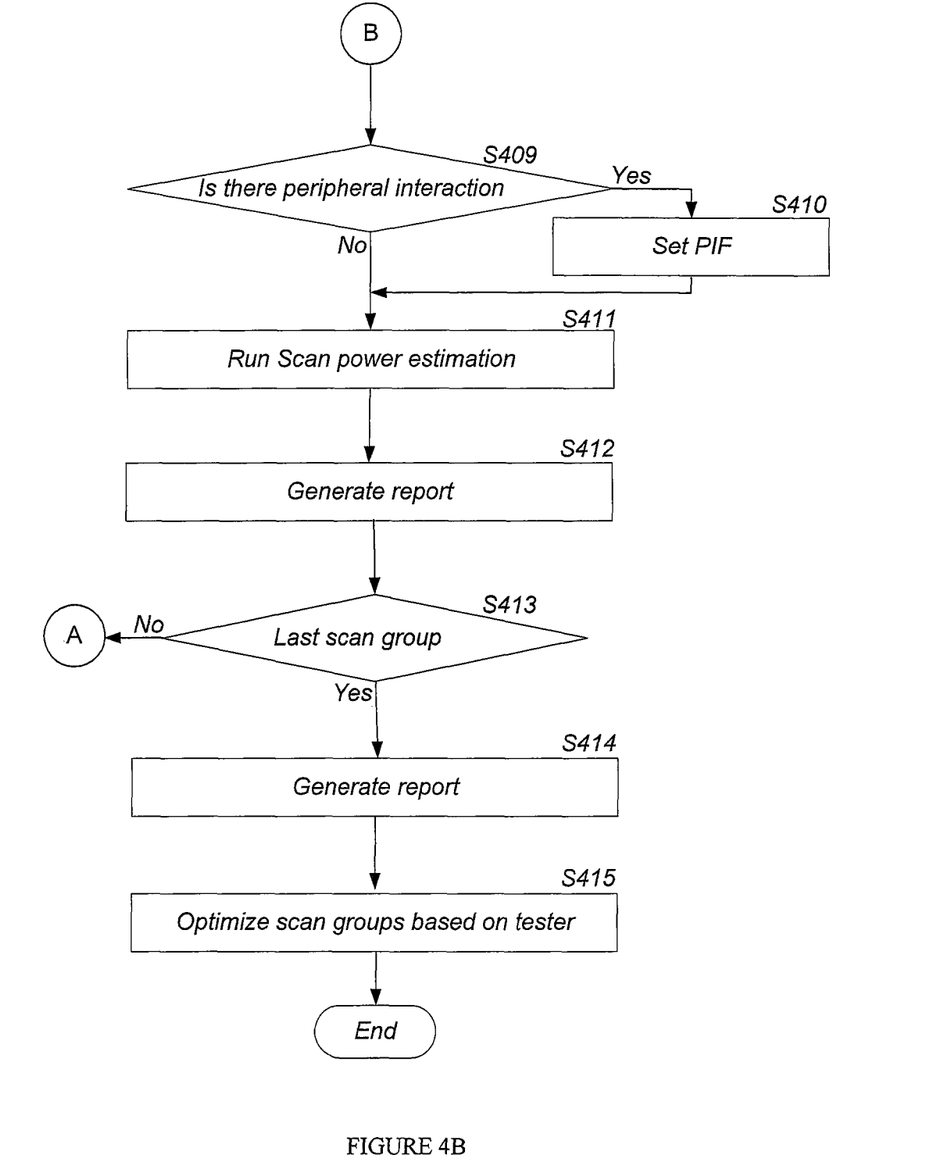

FIGS. 4A-4B show a flow-diagram of the method executed by the SPE 317 according to an exemplary and non-limiting embodiment. As shown in FIG. 4A, information and data required to define the scan group like the RTL 312 and Library 313 are loaded into the system (S401). The SOC design is split into scan groups with peripheral areas isolated from impacting the individual scan operation by disabling the registers connecting to the periphery (S402). A single scan group is selected for power estimation and enabled with its peripherals disabled (S403). The selected scan group is checked to see if the scan group is a special circuit scan group like memory or phase-locked loop (PLL) etc. where the SAF is different from an SAF 321 for a normal scan group (S404). If it is a special circuit scan group then scan mode activity factor (SAF) value for the circuit is estimated from prior knowledge of the circuit and provided to the SPE 317 as an input (S405). If the selected scan group is a normal scan group then the normal SAF value 321 is set for SPE (Typical AF=50%) (S406). The selected scan group is checked to see if it has multiple clock domains in the scan group (S407). If there are multiple clock domains then for each clock domain the value of the clock is set to the right value used for power estimation (S408).

Next, as shown in FIG. 4B, the scan group is checked to determine if it can be isolated, i.e., whether the scan group's boundary is well defined with no peripheral interaction once the registers to the peripheral circuits are disabled (S409). If the scan group is not completely isolated, a peripheral interaction factor (PIF) value estimate is provided as an input to account for the additional power at the boundaries (S410). Using the information input and the circuit definition for the selected scan group the scan power estimation (SPE) is run (S411). The results of the SPE run are captured and tabulated for the use of the design and test groups (S412). The above process is repeated for each of the remaining scan groups and combinations of scan groups as necessary to complete the SPE and generate a set of results and reports (S413). A consolidated data file and report of the results is generated for use in generating the scan test methodology for the SOC on any available tester (S414).

The resulting information is used to automatically or manually generate the test groupings of scan groups for scan test to be implemented on specific testers used for testing of the manufactured SOC (S415). The test groupings of scan groups can be optimized to be under the power capability of the chosen tester grid while reducing the number of total test groupings. SPE hence provides optimized test partitions having acceptable power consumption for the scan test while reducing the test time and providing essentially full test coverage of the circuit elements.

Even though one exemplary mode of implementation of the scan power estimation has been described in the application, it is not meant to be limiting. It will be clear to the practitioners of the art that there are modifications and improvements possible to the basic process disclosed. These modifications and improvements that are possible to the scan power implementation are included and covered as part of the present disclosure.

The principles of the non-limiting method and systems described in the present disclosure are implemented as hardware, firmware, software, or any combination thereof, including but not limited to a CAD system and software products thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit and/or display unit.

All examples and conditional language recited herein are intended for pedagogical purposes to aid the reader in understanding the principles of the non-limiting methods and systems described in the present disclosure and the concepts contributed by the inventor to furthering the art, and are to be construed as being without limitation to such specifically recited examples and conditions. Moreover, all statements herein reciting principles, aspects, and embodiments of the present disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. An apparatus integrated into a design of a system-on-chip (SOC) circuit, the apparatus connected to a plurality of scan groups having one or more clock domains therein, the scan groups further having peripheral isolation and a defined activity factor (AF) for each of the plurality of scan groups, wherein the apparatus is configured to divide the SOC circuit respective of an estimation of power dissipation of each of the plurality of scan groups, wherein for the estimation of power dissipation, the apparatus comprises:
    a first circuit which generates one or more scan groups using at least a register-transfer-level (RTL) design description of the SOC circuit and a circuit library corresponding the SOC circuit;
    a second circuit which establishes a peripheral interaction factor (PIF) for each of the plurality of scan groups;
    a third circuit which performs a power simulation for each of the plurality of scan groups;
    a fourth circuit which generates a report for each of the plurality of scan groups containing at least power consumption data of the plurality of scan groups obtained in response to the power simulation for the plurality of scan groups; and
    a fifth circuit which optimizes the testing of the SOC by grouping the plurality of scan groups into a plurality of test groups based on the power consumption of the plurality of scan groups as provided in the report and at least one of a tester's power capability, desired test time, and test cost on the tester.

2. The apparatus of claim 1, wherein the fifth circuit optimizes the testing by providing an optimum combination of the plurality of scan groups into the plurality of test groups to be tested individually.

3. The apparatus of claim 1, wherein, when the fifth circuit optimizes the testing based on the tester's power capability, the optimizing comprises grouping the plurality of scan groups such that at test time on the tester each test group does not exceed power supply limitations of the tester.

4. The apparatus of claim 1, wherein the second circuit further changes the AF for at least one of the plurality of scan groups to improve scan power estimation.

5. The apparatus of claim 1, wherein the second circuit adjusts the clock frequency value of a clock domain of the at least one scan group of the plurality of scan groups to adjust power of the at least one scan group.

6. The apparatus of claim 1, wherein the third circuit increases the clock frequency value during scan power estimation to speed up testing.

7. The apparatus of claim 1, wherein the third circuit uses the PIF to account for influence of any peripheral circuits that dissipate power during scan power testing of at least one of the one or more scan groups.

* * * * *